United States Patent [19]
Wayman et al.

[11] Patent Number: 5,892,303
[45] Date of Patent: Apr. 6, 1999

[54] COMPACT DESIGN FOR COMBINATION OF AN ELECTRICAL CIRCUIT WITH A SEGMENTED ELECTRODE DEVELOPMENT ROLL

[75] Inventors: William H. Wayman, Ontario, N.Y.; Abdul M. Elhatem, Redondo Beach, Calif.; Paul C. Tien, Torrance, Calif.; Tuan Anh Vo, Hawthorne, Calif.

[73] Assignee: Xerox Corporation, Stamford, Conn.

[21] Appl. No.: 829,647

[22] Filed: Mar. 28, 1997

[51] Int. Cl.⁶ .................................................. G03G 15/00
[52] U.S. Cl. ........................... 307/147; 399/90; 399/285; 399/291
[58] Field of Search ........................... 307/147, 106–108, 307/132 R, 132 M; 174/261, 254, 268, 68.1, 250; 439/67, 69, 74, 77; 361/748, 784, 785, 790, 749, 751, 772, 773, 774, 776, 760, 777, 789; 310/68 B, 266, 236, 233; 200/292; 399/90, 289, 285, 291

[56] References Cited

U.S. PATENT DOCUMENTS

| | | | |
|---|---|---|---|
| 4,271,370 | 6/1981 | DiMeo | 310/266 |
| 4,810,917 | 3/1989 | Kumar et al. | 310/68 B |
| 4,999,762 | 3/1991 | Sakamoto et al. | 361/748 |
| 5,122,674 | 6/1992 | Itou et al. | 307/108 |
| 5,332,869 | 7/1994 | Hagiwara | 361/751 |
| 5,515,142 | 5/1996 | Rommelmann | 399/285 |
| 5,519,578 | 5/1996 | Fujii | 361/751 |
| 5,570,169 | 10/1996 | Hart | 399/285 |
| 5,592,271 | 1/1997 | Parker et al. | 399/285 |
| 5,600,418 | 2/1997 | Hart et al. | 399/285 |

FOREIGN PATENT DOCUMENTS 1120087  5/1989  Japan ..................................... 361/749

*Primary Examiner*—Richard T. Elms
*Attorney, Agent, or Firm*—Fariba Rad

[57] ABSTRACT

A compact design for the electronic circuits to provide electrical contact to a SED roll of a segmented electrode development unit is provided. In this invention, all the required high voltage and low voltage circuitry is placed on a printed flexible circuit which is folded and rolled into a cylindrical circuit to be connected to the SED roll. The flexible printed circuit has a plurality of output terminals each of which will be connected to one of the electrodes of the SED roll.

23 Claims, 13 Drawing Sheets

FIG. 5
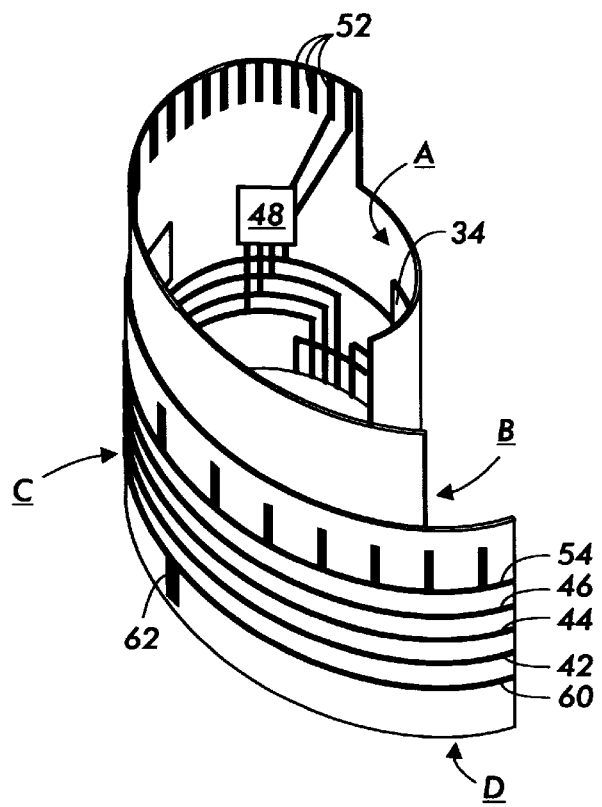
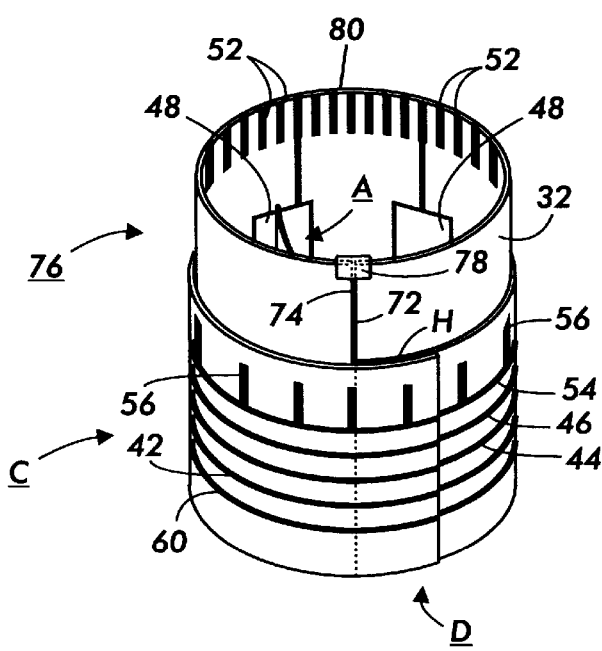
FIG. 6

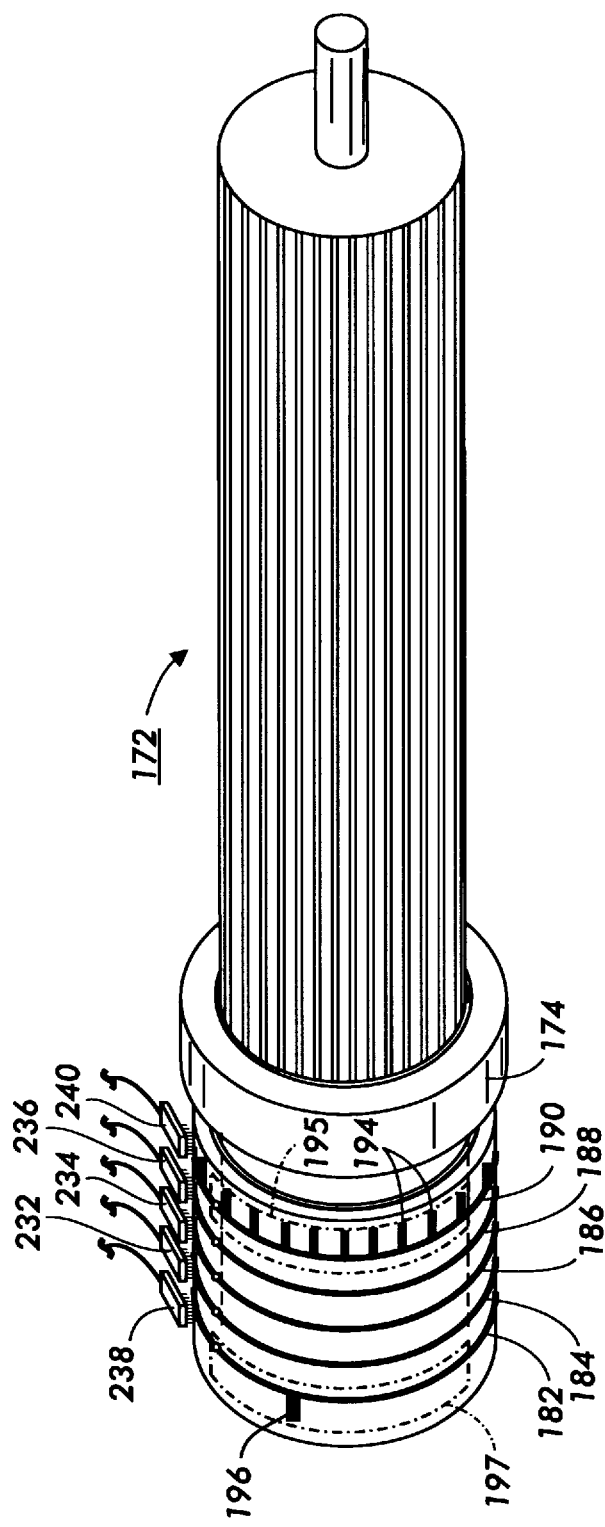

COMPACT DESIGN FOR COMBINATION OF AN ELECTRICAL CIRCUIT WITH A SEGMENTED ELECTRODE DEVELOPMENT ROLL

BACKGROUND OF THE INVENTION

This invention relates generally to a Segmented Electrode Development (SED) unit of a printing system and more particularly concerns a compact design for the electrical connection of a SED roll of a SED unit.

In general, the process of electrophotographic printing includes charging a photoreceptor to a substantially uniform potential so as to sensitize its photoconductive surface. Referring to FIG. 1, there is shown a prior art photoreceptor 10. Usually, a scanning light beam 12 scans a scan line 14 on a photoreceptor 10. The photoreceptor 10 rotates and as a result, the scanning light beam scans consecutive scan lines 14 to discharge the photoreceptor 10 and transfer an image onto the photoreceptor. The image on the photoreceptor 10, which is an electrostatic image, is called a latent image. Once a latent image is created on each scan line, toner has to be placed on each individual scan line 14 to be transferred onto a sheet of paper and then heated to permanently fuse to the sheet of papaer.

One method used for transferring the toner onto the latent image, known as Segmented Electrode Development (SED), uses a SED roll 16. Referring to FIG. 2, there is shown a magnified view of the SED roll 16 of FIG. 1. Referring to both FIGS. 1 and 2, SED roll 16 is a cylindrical member which is placed along the photoreceptor 10 and has a plurality of electrodes 18 that are closely spaced along the SED roll 10.

As the photoreceptor 10 and the SED roll 16 rotate, at any given time, one or multiple electrodes 18 which have the closest distance to the photoreceptor 10 will be activated. The activated electrodes 18 generate a toner cloud 19 along their length in a development region near the photoreceptor. The latent image on each scan line 14 has opposite charge to the charge of the toner in the toner cloud 19. Electrostatic fields generated by the latent image attract toner from the toner cloud 19 to develop the latent image.

In order to activate a selected number of the electrode 18, a carbon electrical brush 20 is used. Electrical brush 20 contacts a portion of the SED roll 16. As the SED roll 16 rotates, different electrodes 18 come in contact with the electrical brush 20.

Electrical brush 20 is not a reliable contact to the electrodes 18. When the electrical brush 20, which has a high voltage of about 1000 volts, connects to each electrode 18 or disconnects from each electrode 18 a phenomenon called "arcing" happens. The connection and disconnection of a 1000 volts to and from an electrode cause large sparks. Since there are plurality of electrodes 18, for example 312 electrodes, on a SED roll 16 and the SED roll 16 rotates at a speed in the range of 400 to 600 rpm, the electrical brush 20 withstands an enormous number of sparks,but gradually, the sparks cause the electrical brush 20 and electrodes 18 to wear off. As a result, the electrical brush 20 has a short life span.

The object of this invention is to provide a reliable solution for the electrical connection to a SED roll.

SUMMARY OF THE INVENTION

The present invention is directed to a compact design for the electronic circuits of a Segmented Electrode Development (SED) unit. In this invention, a printed flexible circuit is used to hold the required circuitry. The printed flexible circuit is folded and rolled to create a cylindrical circuit to be attached to a SED roll of the SED unit. The cylindrical circuit has a plurality of output terminals each of which will be connected to an electrode of a SED roll and a plurality of input terminals to receive the required power to the electronic circuits.

BRIEF DESCRIPTION OF THE DRAWINGS

FIG. 5 shows the process of rolling the flexible circuit of FIG. 3;

FIG. 6 shows the flexible circuit of FIG. 3 rolled into a cylindrical circuit;

FIG. 16 shows the slip ring barrel of FIG. 15 being completely slid over the cylindrical circuit.

DESCRIPTION OF THE PREFERRED EMBODIMENT

Figure 1:
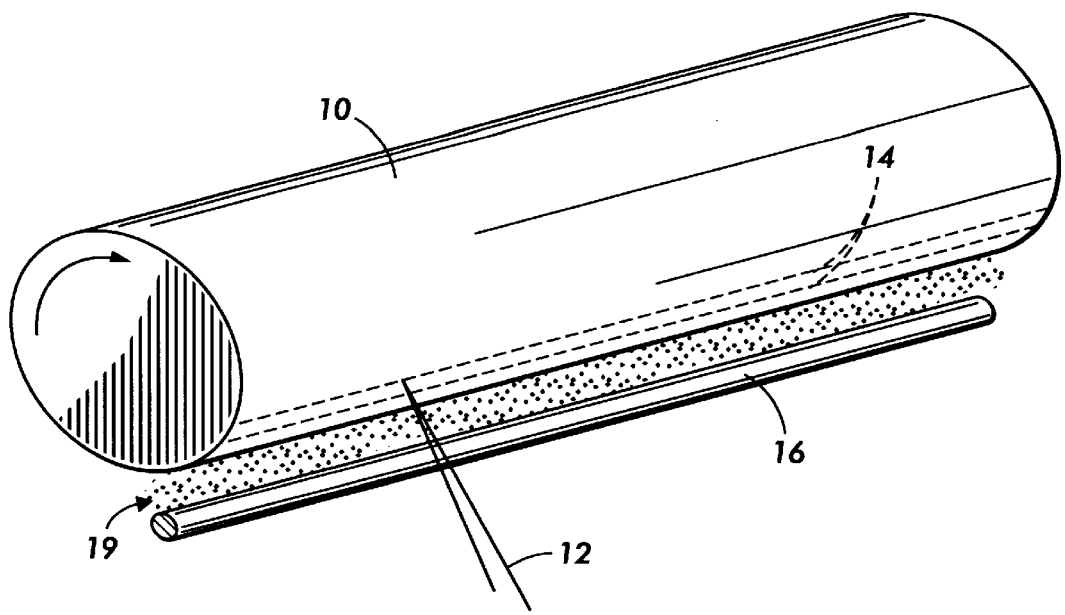
FIG. 1 shows a prior art photoreceptor along with a SED roll.
Figure 2:
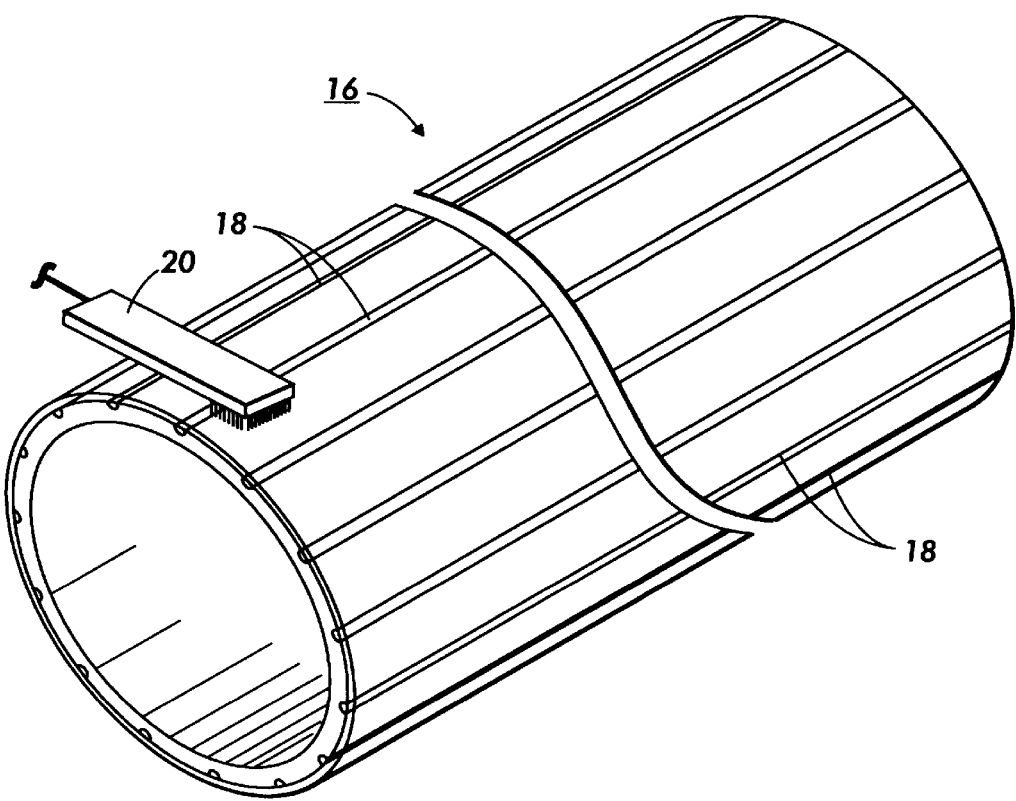
FIG. 2 shows a magnified view of the SED roll of FIG. 1.
Figure 3:
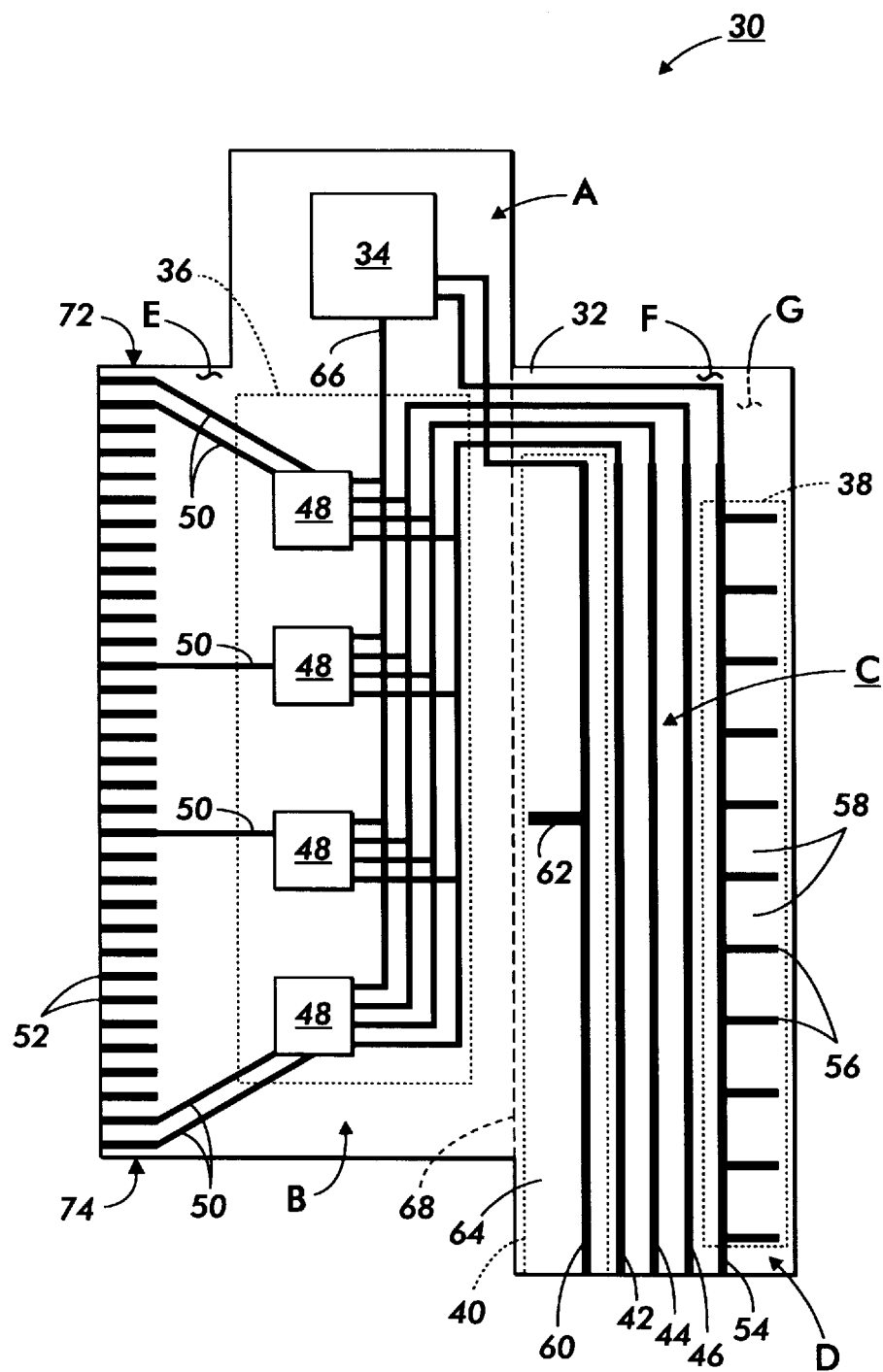
FIG. 3 shows a printed flexible circuit with all the required circuitry to provide electrical connection to a SED roll.
Figure 4:
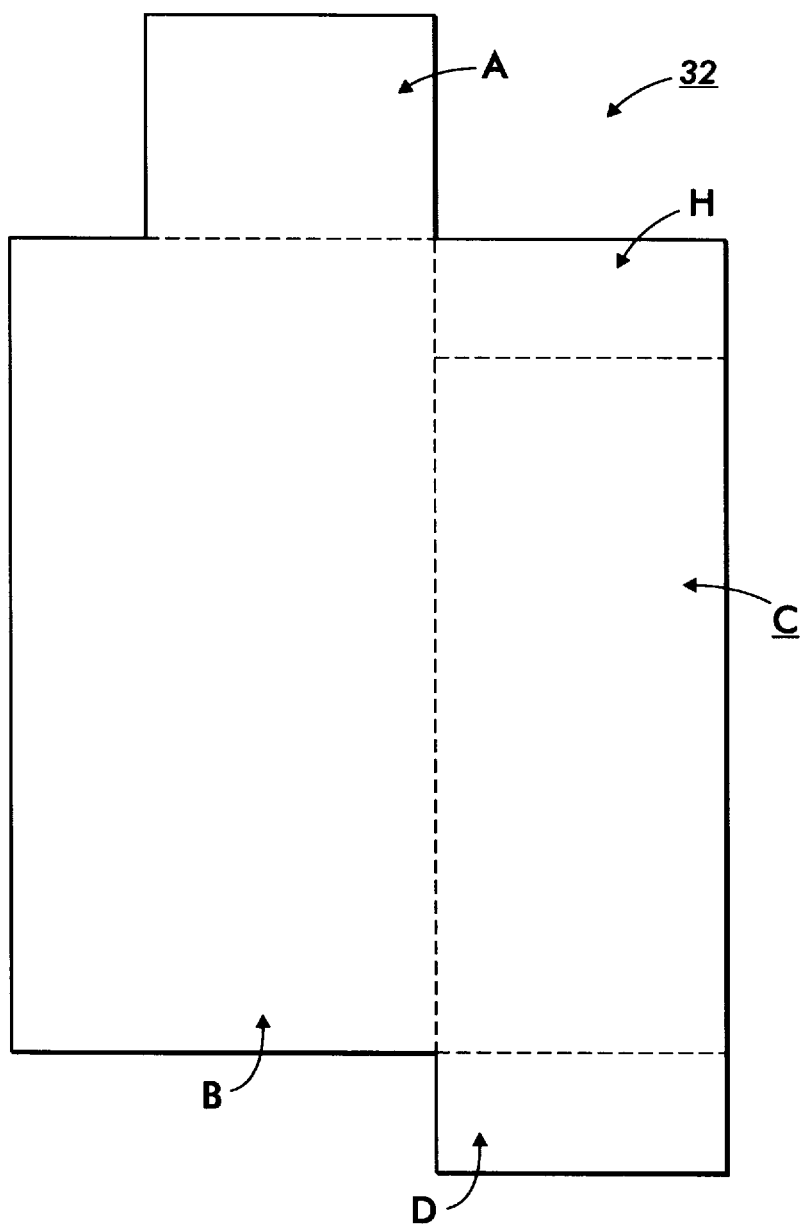
FIG. 4 shows the flexible circuit of FIG. 3 without the electrical circuits and connections.

Referring to FIG. 3, there is shown an electrical connection 30 of this invention. In FIG. 3, there is shown a one piece printed flexible circuit 32, which has a shape that can be defined as four distinct sections A, B, C and D. Referring to FIG. 4, there is shown the printed flexible circuit 32 of FIG. 2 without the electrical circuits and connections in order to distinctly show the sections A, B, C and D. For the purpose of simplicity hereinafter, the "printed flexible circuit" will be referred to as "flexible circuit".

The flexible circuit 32 can be made of multi-layers and as a result, it can have printed circuits on both side. However, for the purpose of simplicity, in this specification, only a one sided flexible circuit is discussed.

Referring back to FIG. 3, the printed flexible circuit 32 holds a low voltage circuit 34, a high voltage circuit 36, a mechanical encoder 38 and an indexing pulse generator 40. In this specification, a low voltage circuit is defined as a circuit which requires less than 15 volts to operate and a high voltage circuit is defined as a circuit which handles voltages such as 1000 volts. Three conductive lines 42, 44 and 46 provide the required power to the low voltage and high voltage circuits 34 and 36. Conductive line 42 provides 5 V to both low voltage and high voltage circuits 34 and 36, conductive line 44 provides ground to both low voltage and high voltage circuits 34 and 36 and conductive line 46 provides 1000 V to the high voltage circuit 36.

The high voltage circuit 36 comprises multiple high voltage chips 48. Each high voltage chip 48 receives a high voltage such as 1000 volts and provides several identical high output voltages such as 1000 volts. Each output voltage of each high voltage chip 48 will be connected to an electrode of a SED roll through a conductive line 50 and an output pin 52. For the purpose of simplicity only a limited number of conductive lines 50 are shown. The output pins 52 are the connecting point of the flexible circuit 32 to the electrodes of a SED roll. The conductive lines 50 and the output pins 52 are printed on the flexible circuit 32. The number of output pins are equal to the number of electrodes on a SED roll.

The mechanical encoder 38 comprises a conductive line 54 and a plurality of parallel conductive lines 56 which are connected to the conductive line 54. If a contact such as an electrical brush, which is connected to a power supply, moves over the conductive lines 56 along the conductive line 54, where it touches the conductive lines 56, it will send in a signal into the conductive line 54 and where it moves into the areas 58 which there is no conductive line, the signal in the conductive line 54 will be disconnected. Therefore, the conductive line 54 receives pulses as the electrical brush moves over the conductive lines 56.

Conductive lines 60 and 62 have a similar function to the mechanical encoder 38. If an electrical brush, which is connected to a power supply, moves over the conductive line 62 along the conductive line 60, where it touches the conductive line 62, it will send in a signal into the conductive line 60 and where it moves into the areas 64 which there is no conductive line, the signal in the conductive line 60 will be disconnected. The pulse generated by the conductive line 62 is used as an indexing pulse. Since the electrical brushes which move over the conductive lines 56 and 62 carry a low voltage, there will be no brush wear or arcing while the electrical brushes connect to or disconnect from the conductive lines 56 and 62.

The low voltage circuit shown as box 34 is built with discrete elements. In the preferred embodiment of this invention, the discrete elements of the low voltage circuit 34 and high voltage chips 48 of the high voltage circuit 36 are surface mounted on the printed flexible circuit 32. However, it should be noted that other mounting methods such as chip on flex or solder bump can replace the surface mount of the disclosed embodiment.

The conductive lines 54 and 60 are connected to the low voltage circuit 34 and therefore, the pulses from the conductive lines 54 and 60 will be delivered to the low voltage circuit 34. The low voltage circuit 34 receives the pulses and process them to provide a selection signal on the conductive line 66. The conductive line 66, which is connected to the high voltage chips 48, delivers the selection signal to the high voltage chips 48.

The selection signal on the conductive line 66 selects the proper high voltage chip 48 and causes the selected high voltage chip 48 to turn on selected outputs to activated only a selected number of the electrodes of a SED roll. It should be noted that for the purpose of simplicity, the selection signal is shown as one line 66. However, the selection of high voltage chips and the selection of the outputs within each chip 48 requires more than one signal and the low voltage circuit sends out multiple selection signals.

For the purpose of connecting the printed flexible circuit 32 to a SED roll, the flexible circuit 32 will be folded along line 68 in such a manner that the surface E and surface F will be facing away from each other and the back side G of the flexible circuit 32 will be inside of the folded flexible circuit. After the flexible circuit 32 is folded, it will be rolled into a substantially cylindrical circuit. Hereinafter, for the purpose of simplicity, the "substantially flexible circuit" will be referred to as "cylindrical circuit". Referring to FIG. 5, in order to create a cylindrical circuit, the flexible circuit 32 has to be rolled in such a manner that sections A and B will be located inside the cylindrical circuit and section C will be outside of the cylindrical shape.

Referring to FIG. 6, the rolled flexible circuit 32 has to be tightened in order to overlap section D over section H. Once section D is placed over section H, they have to be attached to each other by securing means such as adhesive. After section D is attached to section H, each one of the conductive lines 60, 42, 44, 46 and 54 creates a closed loop. On each loop, a conductive material such as epoxy will be applied to the seam line to create a conductive loop. Loops 42 and 44 are the input to the low voltage circuit 34 and high voltage circuit 36 and loop 46 is the input to the high voltage circuit 36. Next, the rolled flexible circuit 32 has to be adjusted to align the edge 72 with the edge 74. Section A of the flexible circuit 32 will be located inside the cylindrical circuit 76. The cylindrical circuit 76 will be secured by a securing means such as a clip 78.

Figure 7:
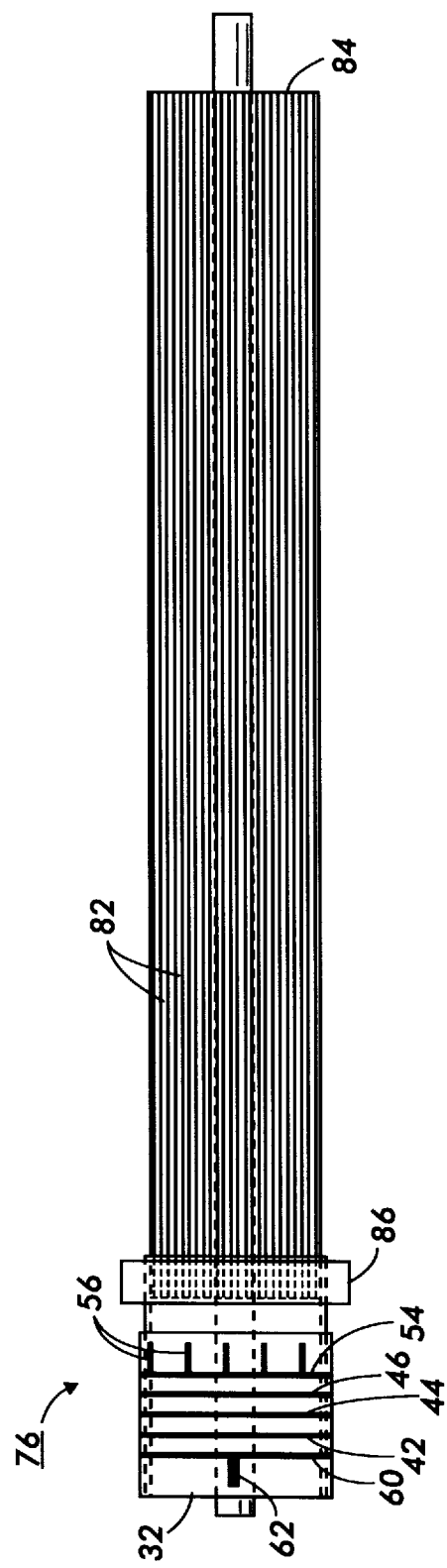
FIG. 7 shows the cylindrical circuit of FIG. 6 being connected to a SED roll.

Once the cylindrical circuit 76 is formed, the output pins 52 of the FIG. 3 will be located inside the cylindrical circuit 76 along the edge 80. Referring to FIG. 7, the cylindrical circuit 76 will be slid over the electrodes 82 of a SED roll 84 in such a manner that only the output pins 52 (FIG. 6) of the cylindrical circuit 76 will be over the SED roller 84. Then, the cylindrical circuit 76 will be adjusted to align each output pin 52 (FIG. 6) to a corresponding electrode 82. To keep the alignment in place, an O-Ring clamp 86 will be used to apply pressure to the contact between the output pins 52 and the electrodes 82 of the SED roll 84. However, this connection is not a sturdy connection.

Figure 8:
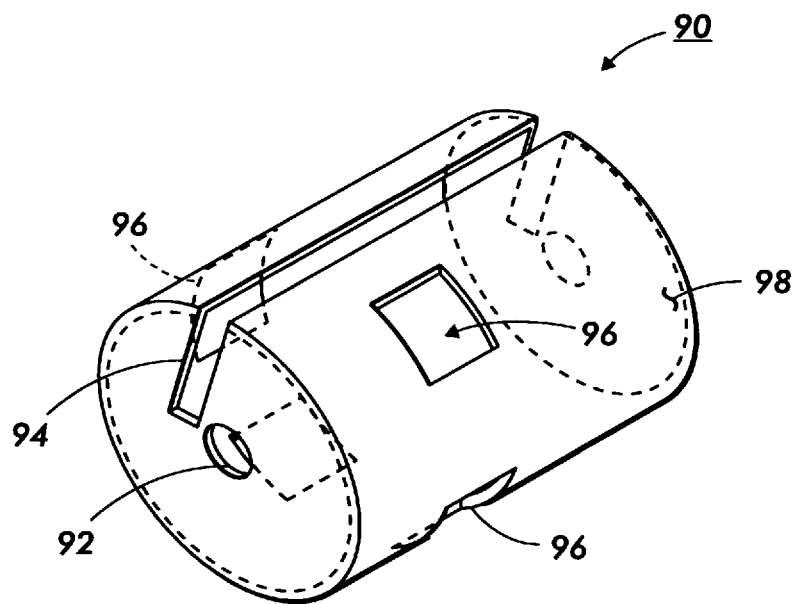
FIG. 8 shows a spool which provides a sturdy connection between a SED roll and the cylindrical circuit of FIG. 6.

In order to create a sturdy connection, a spool is designed to hold the cylindrical circuit 76. Referring to FIG. 8, there is shown a spool 90 which is a connection means between a SED roll and a cylindrical circuit. Spool 90 has a cylindrical opening 92 along its axis for receiving the shaft of a SED roll. The opening 92 is designed to receive the shaft tightly.

The spool has a slit 94 for receiving section A and grooves 96 on its surface 98 to receive the high voltage chips 48 of the flexible circuit 32 of FIG. 3. The flexible circuit 32 of FIG. 3 will be folded along the line 68 and wrapped around the spool 90 in the same manner as creating the cylindrical circuit 76. Prior to wrapping the flexible circuit 32 around spool 90, section A has to be placed in slit 94. While the flexible circuit 32 is being wrapped around the spool 90, each high voltage chip 48 will be placed within its corresponding groove 96.

Referring to FIG. 3 and 6, after the flexible circuit 32 is wrapped around the spool 90, it will be tightened in order to overlap section D over section H. Once section D is placed over section H, they have to be attached to each other by securing means such as adhesive. After section D is attached to section H, each one of the conductive lines 60, 42, 44, 46 and 54 creates a closed loop. On each loop, a conductive material such as epoxy will be applied to the seam line to create a conductive loop. Loops 42 and 44 are the input to the low voltage circuit 34 and high voltage circuit 36 and loop 46 is the input to the high voltage circuit 36. Then, the rolled flexible circuit 32 has to be adjusted to align the edge 72 with the edge 74. Next, the flexible circuit 32 has to be secured to the spool 94 of FIG. 8 by a securing means such as a screw or adhesive.

Figure 9:
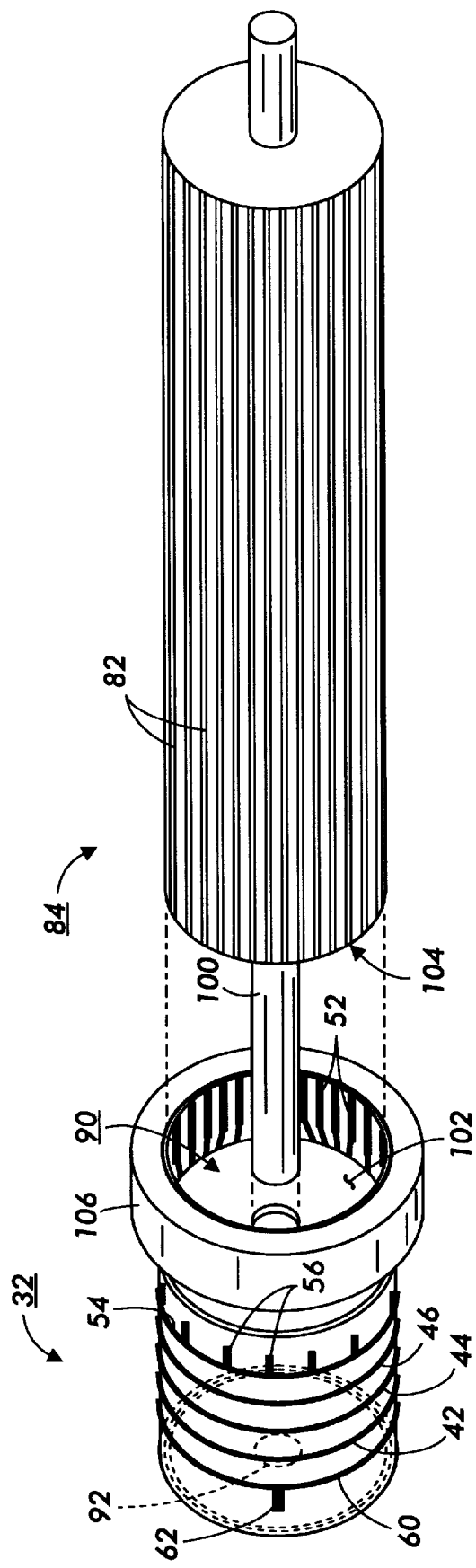
FIG. 9 shows how the spool of FIG. 7 holds the cylindrical circuit of FIG. 6 to be connected to a SED roll.

Referring to both FIGS. 8 and 9, once the flexible circuit 32 is wrapped around the spool 90, a portion of the flexible circuit 32 which holds the output pins 52 will extend beyond the edge of the spool 90 to contact the electrodes 84 of the SED roll 84. Then, the shaft 100 of SED roll 84 will be slid into the opening 92 of the spool 90 until surface 102 of the spool 90 touches surface 104 of the SED roll 84. Spool 90 can be secured to SED roll 84 by any well known mechanical lock. The spool 90 can be designed in such a manner that once it is locked onto the SED roll 84, the output pins 52 of the wrapped flexible circuit 32 will be aligned and have contact with their corresponding electrodes 82. It is immaterial if the flexible circuit 32 is wrapped around the spool 90 and connected to the SED roll 84 or the spool 90 is connected to the SED roll 84 and then the flexible circuit 32 is wrapped around the spool 90.

In order to provide a better connection between the output pins 52 of the flexible circuit 32 and the electrodes 82, an O-ring 106 will be placed over the flexible circuit 32 over the output pins 52. The O-ring 106 will apply pressure to the output pins 52 and keep them secured and aligned with their corresponding electrodes 82 while the SED roll 84 rotates.

It should be noted that the O-ring 106 can be replaced by any means that can provide the same function. For example, the flexible circuit 32 can be connected to the SED roll 84 by a conductive adhesive or soldering.

The enclosed embodiment of this invention eliminates the electrical brush 20 of FIG. 2, but it requires different electrical brushes to provide power to the flexible circuit 32. It should be noted that the electrical brushes used in this invention will have a longer life span and they last much longer than electrical brush 20 of FIG. 2. The design of the enclosed embodiment of this invention provides a solution to elongate the life span of each electrical brush.

Figure 10:
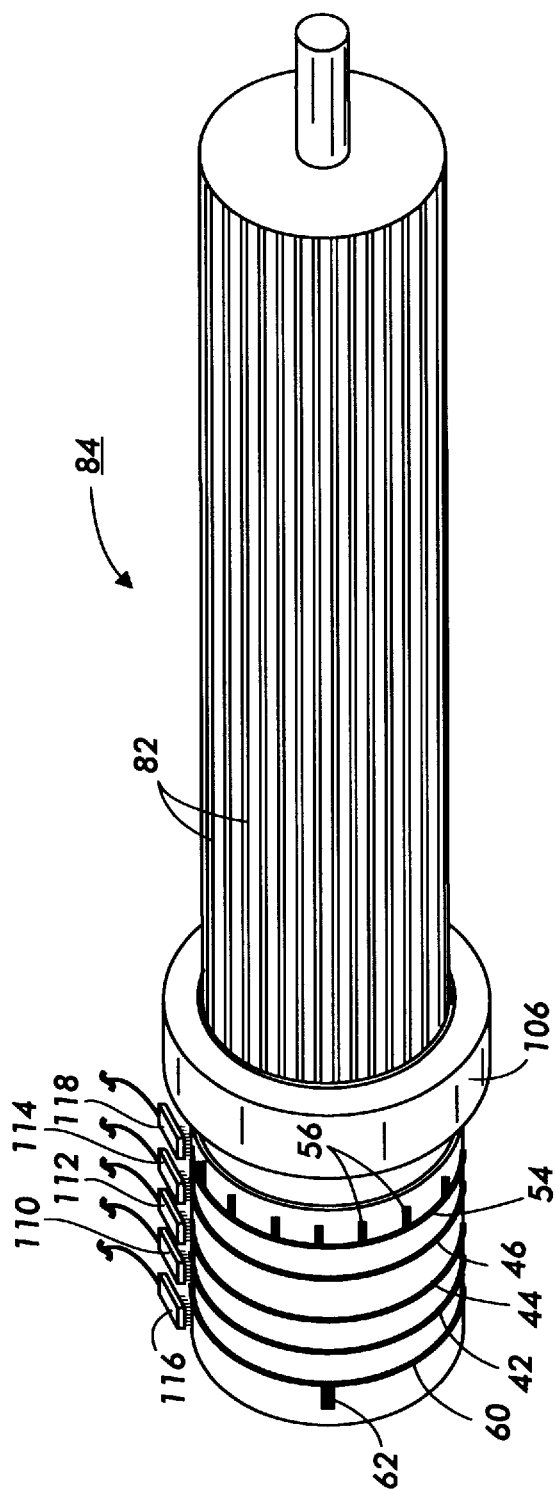
FIG. 10 shows the assembly of FIG. 9 along with the electrical brushes and electrical pin contacts.

Referring to FIG. 10, once the cylindrical circuit 76 is connected to the SED roll 82, three electrical brushes 110, 112 and 114 will provide the power to the flexible circuit 32. Electrical brush 110, which contacts the conductive line (loop) 42, provides 5 volts. Electrical brush 112, which contacts the conductive line (loop) 44, is for the ground. Electrical brush 114, which contacts the conductive line (loop) 46 provides 1000 V. In the same manner the, two electrical brush 116 and 118 create the required pulses on the mechanical encoder 38 and the indexing pulse generator 40.

In this invention as the SED roll rotates, the electrical brushes have a continuous contact with their respective conductive line and therefore, they do not cause any spark. This eliminates the arcing problem and provides a longer life span for the electrical brushes used in this invention.

The indexing pulse generator 40 creates a pulse to indicate each rotation of the SED roll 84. Since there is only one conductive line 62 connected to conductive line 60, only one pulse per rotation will be generated which will be the index for the rotation of the SED roll 84. In the same manner, the mechanical encoder 38 creates pulses as the SED roll rotates. The number of the pulses generated by the mechanical encoder 38, during each rotation of the SED roll 84, is proportional to the number of electrodes 82 of the SED roll 84.

Figure 11:
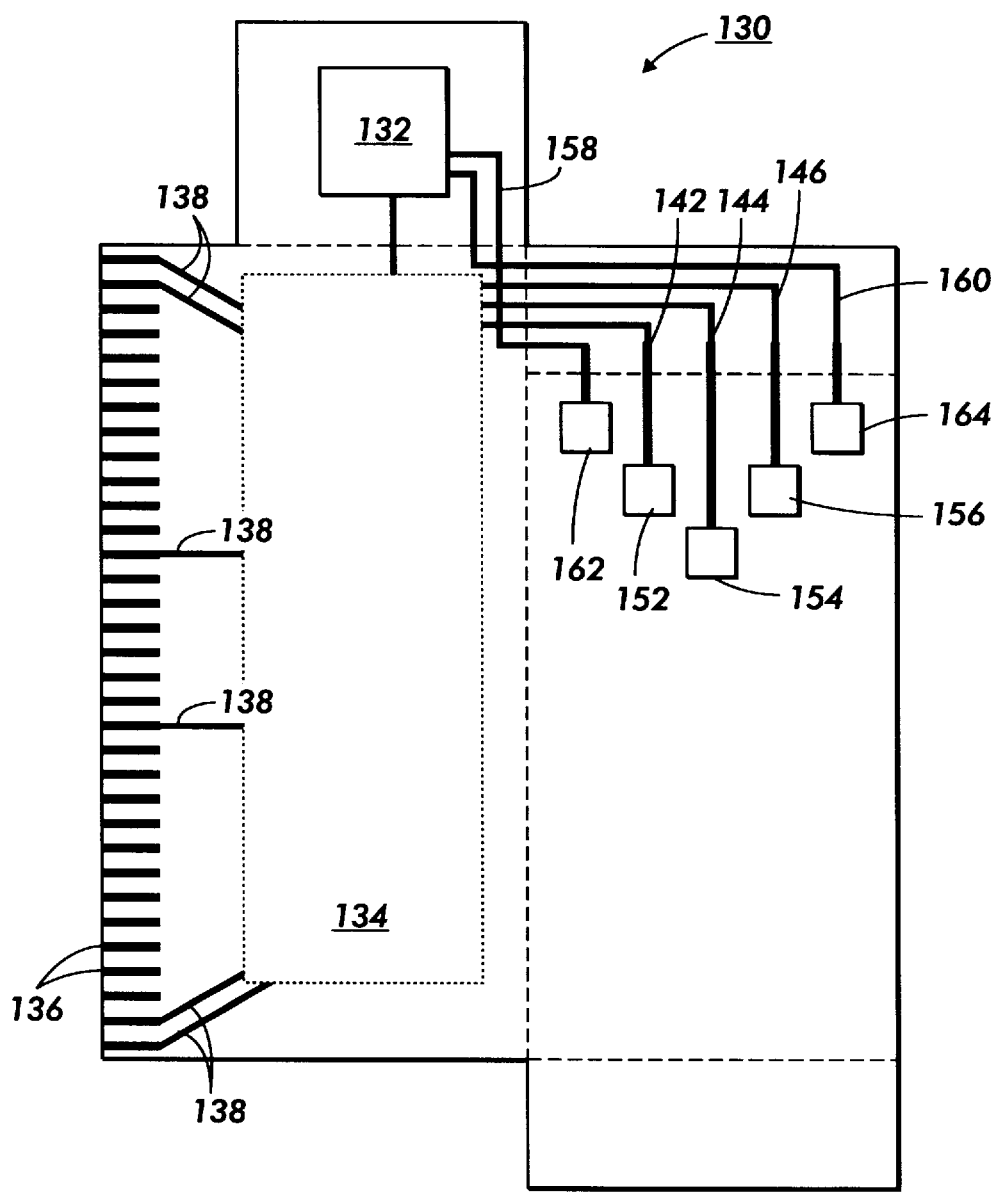
FIG. 11 shows an alternative embodiment of this invention.

Referring to FIG. 11, there is shown an alternative embodiment of this invention which provides a better electrical connection. Flexible circuit 130 comprises a low voltage circuit 132 and a high voltage circuit 134 which are connected to each other in the same manner as the low voltage circuit 34 and the high voltage circuit 36 of FIG. 3. Furthermore, the low voltage circuit 132 and the high voltage circuit 134 are the same and serve the same function as the low voltage circuit 34 and the high voltage circuit 36 of FIG. 3. For the purpose of simplicity, the details of the high voltage circuit 134 is not shown. However, the output pins 136 and a few of the conductive lines 138 which connect the outputs of the high voltage circuit 134 to the output pins 136 are shown.

In FIG. 11, the mechanical encoder 38 of FIG. 3 and the indexing pulse generator 40 of FIG. 3 are removed. Also in FIG. 11, the conductive lines 142, 144 and 146, which are the same as conductive lines 42, 44 and 46 of FIG. 3 respectively, are shortened. Each one of the conductive lines 142, 144 and 146 is connected to a conductive input plate 152, 154 and 156 respectively. Conductive lines 158 and 160, which are connected to the low voltage circuit 132, are also connected to conductive input plates 162 and 164 respectively. Hereinafter, for the purpose of simplicity, the "conductive input plates" will be referred to as "input plates".

Input plate 162 receives an indexing pulse from an external source and input plate 164 receives the required pulses from an external encoder. Likewise, input plates 152 and 156 receive 5 volts and 1000 volts respectively from external sources and input plate 154 connects to an external ground. The connection of the plates 152, 154, 156, 162 and 164 to the external sources will be described in a great detail hereinafter.

Figure 12:
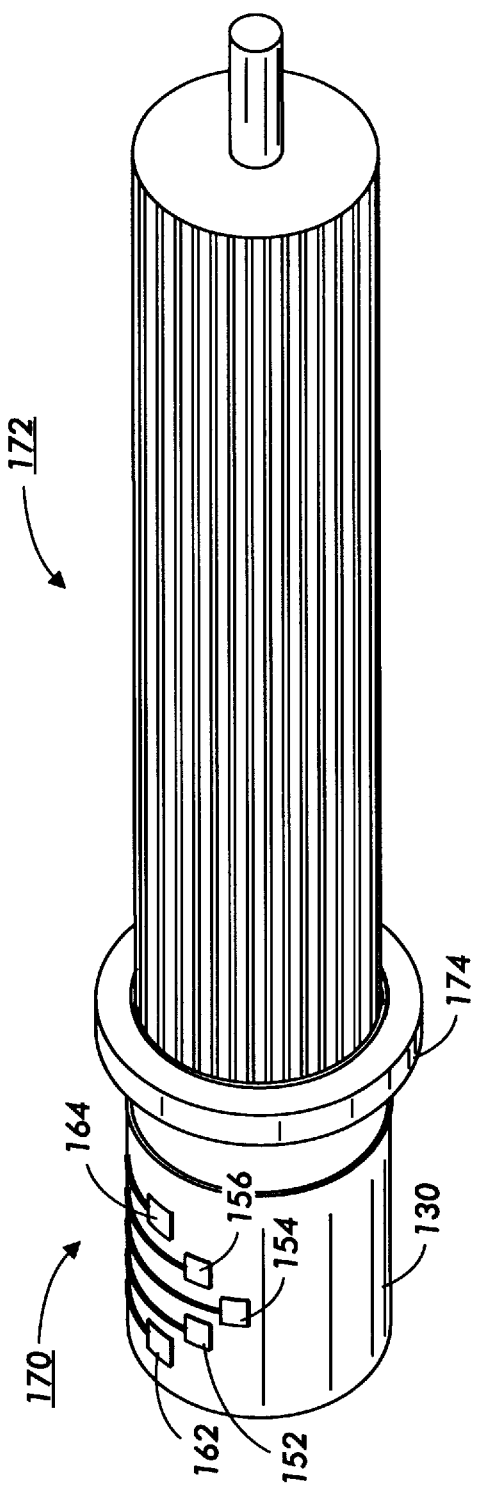
FIG. 12 shows the flexible circuit of FIG. 11 being folded, wrapped around a spool (not shown) and being connected to a SED roll.

Referring to FIG. 12, there is shown the flexible circuit 130 of FIG. 11 being folded, wrapped around a spool (not shown) to create a cylindrical circuit 170 which is connected to a SED roll 172. An O-ring 174 secures the connection of the cylindrical circuit 170 to the SED roll 172.

Figure 13:
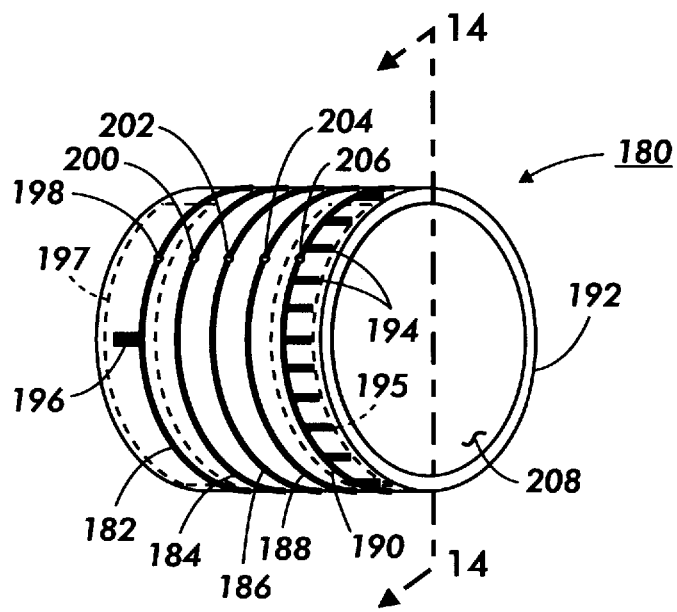
FIG. 13 shows a slip ring barrel.

Referring to FIG. 13, there is shown a slip ring barrel 180. Slip ring barrel 180 is molded to create a smooth cylindrical surface. The slip ring barrel is molded by In-Mold Circuit definition (Two- Shot) process of Mitsui-Pathtek Company. In this process, a non-catalytic resin is injected in a mold which defines the circuit traces. Once the non- catalytic resin is molded and is taken out of the mold, it has grooves for the traces of the circuit both on the outer surface and the inner surface of the barrel.

Next, the barrel will be placed in another mold and a plateable catalytic resin will be injected into the mold to fill in the grooves on the inner surface and outer surface of the barrel. At this point, the barrel will be taken out of the second mold and will be chemically treated to enhance the plateability of the catalytic resin. The chemical treatment roughens the surface of the catalytic resin to create micropores, which function as anchor sites for plating.

On the last step, the barrel will be copper plated to a specific thickness. The copper plating adheres only to the catalytic resin which is located in the grooves of the barrel. Therefore, the copper plating will be located on the traces of the circuit on the outer surface and the inner surface of the barrel to create conductive lines of the barrel.

It should be noted that any process which can create the slip ring barrel 180 of this invention can replace the process of Mitsui-Pathtek.

Referring to FIG. 13, each one of conductive lines 182, 184, 186, 188 and 190 on the outer surface 192 of the slip ring barrel 180 creates a closed loop on the slip ring barrel 180. A plurality of parallel conductive lines 194 are connected to the conductive line 190 to create a mechanical encoder 195 and a conductive line 196 is connected to the conductive line 182 to create an indexing pulse generator 197.

Each conductive line 182, 184, 186, 188 and 190 has a hole 198, 200, 202, 204 and 206 respectively to provide an opening into the inner surface 208. The holes 198, 200, 202, 204 and 206 were created through the molding of the non-catalytic resin. During the injection of the catalytic resin a layer of catalytic resin was placed on the walls of the holes. As a result, during the copper plating step, a layer of copper was adhered to the walls of the holes 198, 200, 202, 204 and 206. Therefore, the holes 198, 200, 202, 204 and 206 provide electrical connection between the outer surface 192 and the inner surface 208 of the barrel 180.

Figure 14:
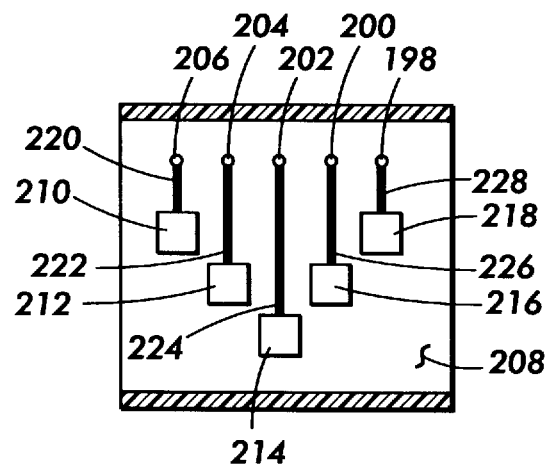
FIG. 14 shows a cross sectional view of FIG. 13 along plane 14.

Referring to FIG. 14, there is shown a cross sectional view of FIG. 13 along plane 14. FIG. 14 shows the inner surface 208 of the slip ring barrel 180. Each one of the holes 198, 200, 202, 204 and 206 is connected to a conductive plate 228, 226, 224, 222 and 220 respectively through a conductive line 220, 222, 224, 226 and 228 respectively.

The holes 198, 200, 202, 204 and 206 provide electrical connection from conductive lines 182, 184, 186, 188 and 190 on the surface 192 (FIG. 13) to the conductive lines 228, 226, 224, 222 and 220 on the inner surface 208 respectively.

Figure 15:
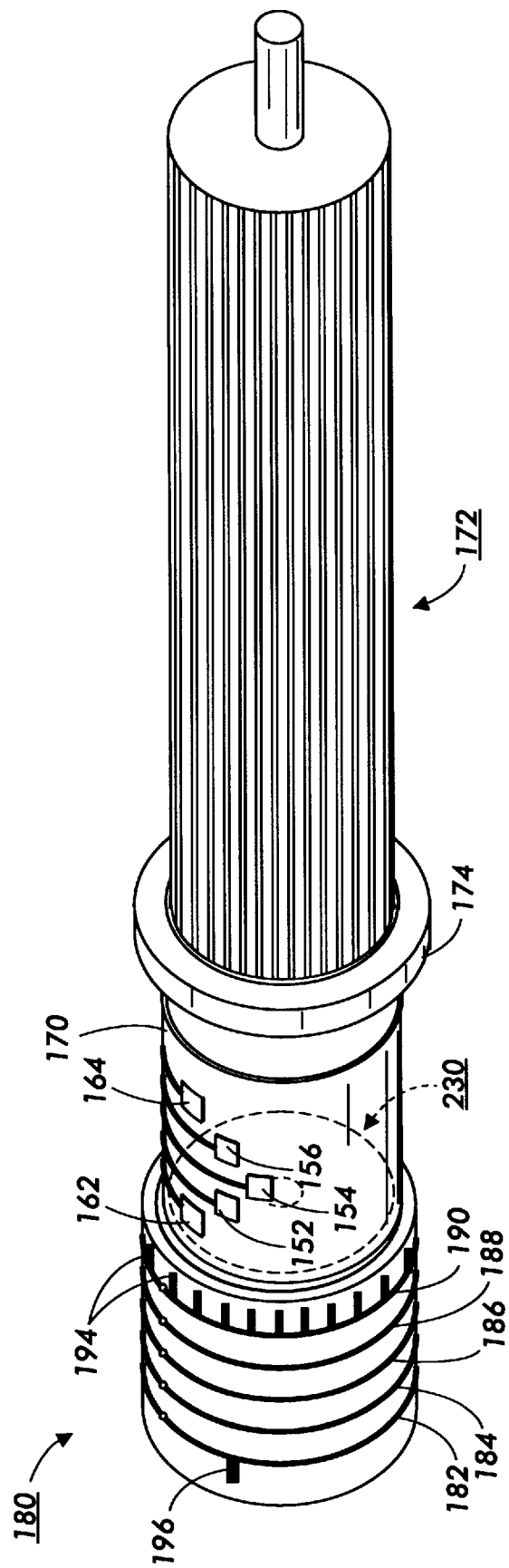
FIG. 15 there is shown the slip ring barrel being slid over the cylindrical circuit of FIG. 12.

Referring to FIG. 15, there is shown the slip ring barrel 180 being slid over the cylindrical circuit 170 of FIG. 12. Once, the slip ring barrel 180 is completely over the cylindrical circuit 170, then it has to be adjusted to align the conductive plates 218, 216, 214, 212 and 210 of the inner surface 208 with the input plates 162, 152, 154, 156 and 164 respectively. The slip ring barrel 180 will be locked onto the cylindrical circuit 170 by any well known mechanical lock. The mechanical lock can be designed to align the input plates 162, 152, 154, 156 and 164 to the conductive plates 218, 216, 214, 212 and 210 respectively.

In addition, spool 230, around which the cylindrical circuit 170 is wrapped, has a plurality of springs (not shown) each of which is located under one of the input plates 162, 152, 154, 156 and 164 of the cylindrical circuit 170. The springs will push the input plates 162, 152, 154, 156 and 164 against the conductive plates 218, 216, 214, 212 and 210 of the slip ring barrel respectively to provide a firm connection.

Referring to FIG. 16, there is shown the slip ring barrel of FIG. 15 which is completely slid over the cylindrical circuit 170. Once the slip ring barrel 180 is placed over the cylindrical circuit 170, electrical brushes 232, 234 and 236 will provide the power to the cylindrical circuit 170. Electrical brush 232, which contacts the conductive line (loop) 184, provides 5 volts. Electrical brush 234, which contacts the conductive line (loop) 186, is for the ground. Electrical brush 236, which contacts the conductive line (loop) 188 provides 1000 V. In the same manner, the two electrical brush 240 and 238 create pulses on the mechanical encoder 195 and the indexing pulse generator 197 respectively.

It should be noted that in this invention, depending on the requirements of the high voltage circuit and low voltage circuit, the number of electrical brushes can change.

It should also be noted that in the disclosed embodiments of this invention, the SED roll, the cylindrical circuit and the slip ring barrel are disclosed to have cylindrical or substantially cylindrical shapes. However, the SED roll, the cylindrical circuit and the slip ring barrel need not be limited to cylindrical shapes.

It should further be noted that numerous changes in details of construction and the combination and arrangement of elements may be resorted to without departing from the true spirit and scope of the invention as hereinafter claimed.

We claim:

1. A combination of an electrical circuit with an elongated member comprising;

an elongated member having an outer surface, a first axial end and a second axial end;

an elongated hollow element having an outer surface, an inner surface, a first axial end and a second axial end;

said elongated hollow element having an electrical circuit;

said electrical circuit comprising a low voltage circuit and a high voltage circuit electrically connected to each other;

said electrical circuit having a plurality of input terminals and a plurality of output terminals;

at least one of said plurality of input terminals being electrically connected to said high voltage circuit;

the remaining terminals of said plurality of input terminals being electrically connected to said low voltage circuit and said high voltage circuit;

said plurality of output terminals being electrically connected to said high voltage circuit;

said plurality of output terminals being located on said inner surface of said element at said first axial end of said element;

said elongated member having a plurality of electrical conductors on said outer surface extending to said first axial end of said first elongated member;

said inner surface of said elongated member at said first axial end of said element partially receiving said outer surface of said elongated member and surrounding said elongated member at said first axial end of said elongated member; and each one of said plurality of output terminals having a contact with a corresponding one of said plurality of electrical conductors of said elongated member.

2. The combination of an electrical circuit with an elongated member recited in claim 1, wherein said elongated member is a SED roll of a segmented electrode development unit.

3. The combination of an electrical circuit with an elongated member recited in claim 1, wherein said element is a substantially cylindrical circuit.

4. The combination of an electrical circuit with an elongated member recited in claim 3, wherein said substantially cylindrical circuit is a printed flexible circuit.

5. The combination of an electrical circuit with an elongated member recited in claim 3, wherein said inner surface of said element is one piece and said outer surface of said element is another piece connected to each other on said second axial end of said substantially cylindrical circuit.

6. The combination of an electrical circuit with an elongated member recited in claim 5, wherein said elongated member is a SED roll of a segmented electrode development unit.

7. The combination of an electrical circuit with an elongated member recited in claim 6, wherein said low voltage circuit, said high voltage circuit and said plurality of output terminals are located on said inner surface of said element and said input terminals are located on said outer surface of said element.

8. The combination of an electrical circuit with an elongated member recited in claim 7, wherein said high voltage circuit further comprises a plurality of high voltage chips.

9. The combination of an electrical circuit with an elongated member recited in claim 8, wherein said substantially cylindrical circuit is a printed flexible circuit.

10. The combination of an electrical circuit with an elongated member recited in claim 6, wherein said substantially cylindrical circuit further comprises a mechanical encoder and an indexing pulse generator.

11. The combination of an electrical circuit with an elongated member recited in claim 10, wherein said mechanical encoder further comprises a plurality of parallel conductive lines which have a first end and a second end and said first end of said plurality of conductive lines being electrically connected to one conductive line.

12. The combination of an electrical circuit with an elongated member recited in claim 11, wherein said plurality of parallel conductive lines and said one conductive line being located on said outer surface of said substantially cylindrical circuit.

13. The combination of an electrical circuit with an elongated member recited in claim 12, wherein said substantially cylindrical circuit is a printed flexible circuit.

14. The combination of an electrical circuit with an elongated member recited in claim 10, wherein said indexing pulse generator further comprises a first conductive line which has a first end and a second end and said first end of said first conductive line being electrically connected to a second conductive line.

15. The combination of an electrical circuit with an elongated member recited in claim 14, wherein said first conductive line and said second conductive line of said indexing pulse generator being located on said outer surface of said substantially cylindrical circuit.

16. The combination of an electrical circuit with an elongated member recited in claim 15, wherein said substantially cylindrical circuit is a printed flexible circuit.

17. The combination of an electrical circuit with an elongated member recited in claim 1, wherein said low voltage circuit and said high voltage circuit are located on said inner surface of said element and input terminals being located on said outer surface of said element.

18. The combination of an electrical circuit with an elongated member recited in claim 17, wherein said high voltage circuit further comprises a plurality of high voltage chips.

19. The combination of an electrical circuit with an elongated member recited in claim 1, wherein said element further comprises a mechanical encoder and an indexing pulse generator.

20. The combination of an electrical circuit with an elongated member recited in claim 19, wherein said mechanical encoder further comprises a plurality of parallel conductive lines which have a first end and a second end and said first end of said plurality of conductive lines being electrically connected to one conductive line.

21. The combination of an electrical circuit with an elongated member recited in claim 20, wherein said plurality of parallel conductive lines and said one conductive line being located on said outer surface of said element.

22. The combination of an electrical circuit with an elongated member recited in claim 19, wherein said indexing pulse generator further comprises a first conductive line which has a first end and a second end and said first end of said first conductive line being electrically connected to a second conductive line.

23. The combination of an electrical circuit with an elongated member recited in claim 22, wherein said first conductive line and said second conductive line of said indexing pulse generator being located on said outer surface of said element.

* * * * *